United States Patent
Tanaka

(10) Patent No.: US 9,759,866 B2
(45) Date of Patent: Sep. 12, 2017

(54) OPTICAL COMBINER, LASER DEVICE USING SAME, AND METHOD FOR MANUFACTURING OPTICAL COMBINER

(71) Applicant: FUJIKURA LTD., Tokyo (JP)

(72) Inventor: Hironori Tanaka, Sakura (JP)

(73) Assignee: FUJIKURA LTD., Tokyo (JP)

( * ) Notice: Subject to any disclaimer, the term of this patent is extended or adjusted under 35 U.S.C. 154(b) by 0 days.

(21) Appl. No.: 15/016,445

(22) Filed: Feb. 5, 2016

(65) Prior Publication Data

US 2016/0161674 A1 Jun. 9, 2016

Related U.S. Application Data

(63) Continuation of application No. PCT/JP2014/064583, filed on Jun. 2, 2014.

(30) Foreign Application Priority Data

Aug. 9, 2013 (JP) ................................. 2013-166863

(51) Int. Cl.
  *G02B 6/28* (2006.01)
  *G02B 6/26* (2006.01)
  *H01S 3/094* (2006.01)
  *G02B 6/255* (2006.01)
  *H01S 3/0941* (2006.01)

(52) U.S. Cl.
  CPC ......... *G02B 6/2856* (2013.01); *G02B 6/2551* (2013.01); *G02B 6/262* (2013.01); *H01S 3/094003* (2013.01); *H01S 3/09408* (2013.01); *H01S 3/09415* (2013.01); *H01S 3/094053* (2013.01)

(58) Field of Classification Search
  CPC .................................. G02B 6/28; G02B 6/255
  USPC .............................................................. 385/24
  See application file for complete search history.

(56) References Cited

U.S. PATENT DOCUMENTS

| | | | | |
|---|---|---|---|---|
| 4,799,949 A | * | 1/1989 | Keck et al. | 65/409 |
| 5,177,803 A | * | 1/1993 | Newhouse et al. | 385/43 |
| 5,339,372 A | * | 8/1994 | Miller et al. | 385/29 |
| 5,761,234 A | * | 6/1998 | Craig et al. | 372/75 |

(Continued)

FOREIGN PATENT DOCUMENTS

| | | | | |
|---|---|---|---|---|
| EP | 2071376 A1 | * | 6/2009 | ............ G02B 6/28 |
| JP | 4-361204 A | | 12/1992 | |

(Continued)

OTHER PUBLICATIONS

International Search Report dated Aug. 26, 2014, issued in counterpart application No. PCT/JP2014/064583 (2 pages).

(Continued)

*Primary Examiner* — Kaveh C Kianni
(74) *Attorney, Agent, or Firm* — Westerman, Hattori, Daniels & Adrian, LLP

(57) ABSTRACT

An optical combiner 3 includes a plurality of incoming optical fibers 10, an outgoing optical fiber 20, and a plurality of bridge fibers 60, 50 provided between the plurality of incoming optical fibers 10 and the outgoing optical fiber 20, the plurality of bridge fibers 60, 50 being optically coupled to each other. In the bridge fibers 60, 50, a ratio of the outer diameter of a core 61, 51 to the outer diameter of a cladding 62, 52 is smaller in a bridge fiber located more apart from the incoming optical fiber 10.

7 Claims, 5 Drawing Sheets

(56) References Cited

U.S. PATENT DOCUMENTS

| | | | |
|---|---|---|---|
| 5,864,644 A * | 1/1999 | DiGiovanni et al. | 385/43 |
| 5,930,435 A * | 7/1999 | Laming et al. | 385/126 |
| 6,282,342 B1 * | 8/2001 | Berkey et al. | 385/43 |
| 6,324,326 B1 * | 11/2001 | Dejneka et al. | 385/123 |
| 6,434,302 B1 * | 8/2002 | Fidric et al. | 385/43 |
| 7,272,956 B1 * | 9/2007 | Anikitchev et al. | 65/409 |
| 8,160,415 B2 * | 4/2012 | Shkurikhin et al. | 385/115 |
| 8,514,485 B2 * | 8/2013 | Rothenberg | 359/341.1 |
| 8,515,220 B1 * | 8/2013 | Khitrov et al. | 385/14 |
| 9,063,289 B1 * | 6/2015 | Farmer et al. | |
| 2005/0094952 A1 * | 5/2005 | Gonthier et al. | 385/100 |
| 2005/0105854 A1 * | 5/2005 | Dong et al. | 385/46 |
| 2005/0207454 A1 * | 9/2005 | Starodoumov et al. | 372/4 |
| 2005/0207455 A1 * | 9/2005 | MacCormack et al. | 372/6 |
| 2006/0187541 A1 * | 8/2006 | Starodoumov | 359/341.32 |
| 2006/0263024 A1 * | 11/2006 | Dong et al. | 385/125 |
| 2007/0206909 A1 * | 9/2007 | Wetter et al. | 385/92 |
| 2007/0212006 A1 * | 9/2007 | Wysocki | 385/115 |
| 2007/0230881 A1 * | 10/2007 | Tammela et al. | 385/115 |
| 2007/0237453 A1 * | 10/2007 | Nielsen et al. | 385/28 |
| 2007/0280597 A1 * | 12/2007 | Nakai et al. | 385/43 |
| 2008/0050069 A1 * | 2/2008 | Skovgaard et al. | 385/39 |
| 2008/0193093 A1 * | 8/2008 | DiGiovanni et al. | 385/115 |
| 2008/0267560 A1 * | 10/2008 | DiGiovanni et al. | 385/28 |
| 2009/0080469 A1 * | 3/2009 | Nikolajsen | 372/6 |
| 2009/0154881 A1 * | 6/2009 | Salokatve | 385/46 |
| 2009/0154882 A1 * | 6/2009 | Salokatve | 385/50 |
| 2009/0175301 A1 * | 7/2009 | Li et al. | 372/6 |
| 2009/0202204 A1 * | 8/2009 | Nielsen et al. | 385/43 |
| 2010/0278486 A1 * | 11/2010 | Holland et al. | 385/43 |
| 2011/0032602 A1 * | 2/2011 | Rothenberg | 359/341.1 |
| 2011/0274435 A1 * | 11/2011 | Fini et al. | 398/139 |
| 2012/0127563 A1 * | 5/2012 | Farmer et al. | 359/341.3 |
| 2012/0262781 A1 * | 10/2012 | Price et al. | 359/341.3 |
| 2014/0119694 A1 * | 5/2014 | Abedin et al. | 385/43 |
| 2014/0186040 A1 | 7/2014 | Fujiwara et al. | |
| 2014/0205236 A1 * | 7/2014 | Noguchi et al. | 385/33 |
| 2014/0294345 A1 * | 10/2014 | Kopp et al. | 385/24 |

FOREIGN PATENT DOCUMENTS

| | | |
|---|---|---|
| JP | 9-218319 A | 8/1997 |
| JP | 2000-141073 A | 5/2000 |
| JP | 2009-230080 A | 10/2009 |
| JP | 2012-129426 A | 7/2012 |
| JP | 5089950 B2 | 12/2012 |
| JP | 5216151 B1 | 6/2013 |
| WO | 2013/038761 A1 | 3/2013 |
| WO | 2013/046696 A1 | 4/2013 |

OTHER PUBLICATIONS

Reason for refusal dated Jan. 27, 2015 issued in JP 2013-166863.
With English Translation of Office Action dated Aug. 19, 2016, issued in counterpart Chinese Patent Application No. 201480044303.1.
European Search Report dated May 11, 2017, issued in counterpart application No. 14835070.5 (11 pages).

* cited by examiner

OPTICAL COMBINER, LASER DEVICE USING SAME, AND METHOD FOR MANUFACTURING OPTICAL COMBINER

TECHNICAL FIELD

The present invention relates to an optical combiner, a laser device using the same, and a method for manufacturing an optical combiner.

BACKGROUND ART

Heretofore, for example, Patent Literature 1 below proposes an optical combiner to combine light beams emitted from a plurality of laser light sources with one optical fiber.

A multiport coupler described in Patent Literature 1 includes a signal fiber 5 disposed in the center and a plurality of pumping fibers 4 integrally disposed around the signal fiber 5, in which the diameter of the tip end of the multiport coupler is decreased. Around a core 6 of the signal fiber 5 disposed in the center, a radiation confinement waveguide portion 7 is concentrically provided. The radiation confinement waveguide portion 7 has an outer diameter greater than the outer diameter of the core 6, and has a refractive index greater than the refractive index of a cladding 8 and smaller than the refractive index of the core 6.

The radiation confinement waveguide portion 7 confines returning light leaking from the core of a cladding pump fiber 3 at the connecting portion of the multiport coupler to the cladding pump fiber 3 connected at the end portion of the multiport coupler where the diameter is decreased. Thus, the radiation confinement waveguide portion 7 reduces the failure of a pump light source caused by the returning light.

[Patent Literature 1] Japanese Patent No. 5089950

SUMMARY OF INVENTION

An optical fiber, which is connected to the emission end of the multiport coupler including a bundle of the pumping fiber 4 and the signal fiber 5, is typically necessary to decrease the outer diameter of the core in order to satisfy single mode conditions as the cladding has a certain outer diameter or greater for providing a structure of excellent mechanical properties. Consequently, the outer diameter of the end face of the multiport coupler where the diameter is not decreased tends to be increased.

On the other hand, since the multiport coupler is demanded to emit laser light of high beam density, the outer diameter of the end face of the multiport coupler where the diameter is decreased tends to be shortened.

As described above, in the multiport coupler according to Patent Literature 1 above, the diameter difference between the end faces where the diameter is not decreased and where the diameter is decreased tends to be increased. A greater diameter difference, for example, more tends to cause problems, such as easy distortion of the end face of the multiport coupler where the diameter is decreased, leading to concern about reliability.

Therefore, it is an objective of the present invention to provide an optical combiner that can improve reliability, a laser device using the same, and a method for manufacturing an optical combiner.

To achieve the above objective, an optical combiner of the present invention includes: a plurality of incoming optical fibers; an outgoing optical fiber; and a plurality of bridge fibers provided between the plurality of incoming optical fibers and the outgoing optical fiber, the plurality of bridge fibers being optically coupled to each other, and each of the plurality of bridge fibers has a core, a cladding that surrounds an outer circumferential surface of the core, and a tapered portion where an outer diameter is more decreased toward an emission end, and in the plurality of bridge fibers, a ratio of an outer diameter of the core to an outer diameter of the cladding is smaller in a bridge fiber located more apart from the incoming optical fibers.

Further, an optical combiner of the present invention includes: a plurality of incoming optical fibers; an outgoing optical fiber; and a plurality of bridge fibers provided between the plurality of incoming optical fibers and the outgoing optical fiber, the plurality of bridge fibers being optically coupled to each other, and each of the plurality of bridge fibers has a tapered portion where an outer diameter is more decreased toward an emission end; and in the plurality of bridge fibers, a bridge fiber to which the plurality of incoming optical fibers is coupled entirely propagates a light beam, and one, two, or more bridge fibers other than the bridge fiber have a core and a cladding that surrounds an outer circumferential surface of the core.

In such an optical combiner, as compared with the case of using one bridge fiber in which the ratio of the outer diameter of the core to the outer diameter of the cladding is the same instead of the plurality of bridge fibers above, it is possible to decrease the diameter difference between the incoming end face of the bridge fiber to which the plurality of incoming optical fibers is coupled and the outgoing end face of the bridge fiber to which the outgoing optical fiber is coupled. Thus, it is possible to decrease the distortion of the tapered portion of the bridge fiber.

As compared with the case of using one bridge fiber in which the ratio of the outer diameter of the core to the outer diameter of the cladding is the same instead of the plurality of bridge fibers above, the ratio of the outer diameter of the core to the outer diameter of the cladding can be made smaller on the outgoing end face of the bridge fiber to which the outgoing optical fiber is coupled. Thus, the bridge fiber can be more firmly coupled to the outgoing optical fiber.

Accordingly, the improvement of the reliability of the optical combiner is achieved.

Preferably, two or more bridge fibers are present other than a bridge fiber to which the plurality of incoming optical fibers is coupled, and in the two or more bridge fibers, a ratio of an outer diameter of the core to an outer diameter of the cladding is smaller in a bridge fiber located more apart from the incoming optical fibers.

In the case in which the optical combiner is thus formed, as compared with the case in which one bridge fiber is present other than the bridge fiber to which the plurality of incoming optical fibers is coupled, the ratio of the outer diameter of the core to the outer diameter of the cladding can be further decreased on the outgoing end face of the bridge fiber to which the outgoing optical fiber is coupled. Thus, it is possible to further reinforce the coupling of the bridge fiber to the outgoing optical fiber.

Preferably, a refractive index difference between the core and the cladding is greater in a bridge fiber located more apart from the incoming optical fibers.

In the case in which the optical combiner is thus formed, the mode number of light beams propagating through the bridge fiber can be more increased in a bridge fiber located more apart from the incoming optical fiber. Thus, it is possible to further reduce the leakage of a light beam from the connecting portion of the adjacent bridge fibers.

Preferably, in adjacent bridge fibers in the plurality of bridge fibers, an outer diameter of the core on an outgoing end face of a bridge fiber located on the incoming optical fiber side is smaller than an outer diameter of the core on an incoming end face of a bridge fiber located on the outgoing optical fiber side.

In the case in which the optical combiner is thus formed, it is possible to further reduce the leakage of a light beam from the connecting portion of the adjacent bridge fibers.

A laser device according to the present invention is a laser device including any one of the above optical combiners and a laser light source for applying laser light to the incoming optical fiber.

According to the laser device thus formed, the laser device includes the optical combiner that can improve reliability as described above. Thus, the improvement of the reliability of the laser device is achieved.

A method for manufacturing an optical combiner according to the present invention is a method for manufacturing an optical combiner including: a first fusion splicing process of fusion-splicing an outgoing end face of a plurality of incoming optical fibers to an incoming end face of a first bridge fiber; a second fusion splicing process of fusion-splicing an incoming end face of an outgoing optical fiber to an outgoing end face of a second bridge fiber; and a coupling process of optically coupling the first bridge fiber to the second bridge fiber. In the method, each of the first bridge fiber and the second bridge fiber has a core, and a cladding that surrounds an outer circumferential surface of the core.

A method for manufacturing an optical combiner according to the present invention is a method for manufacturing an optical combiner including: a first fusion splicing process of fusion-splicing an outgoing end face of a plurality of incoming optical fibers to an incoming end face of a first bridge fiber; a second fusion splicing process of fusion-splicing an incoming end face of an outgoing optical fiber to an outgoing end face of a second bridge fiber; and a coupling process of optically coupling the first bridge fiber to the second bridge fiber. In the method, each of the first bridge fiber and the second bridge fiber has a tapered portion where an outer diameter is decreased toward an emission end. The first bridge fiber entirely propagates a light beam, and the second bridge fiber has a core and a cladding that surrounds an outer circumferential surface of the core.

In such a method for manufacturing an optical combiner, the first bridge fiber is fusion-spliced to the plurality of incoming optical fibers, the second bridge fiber is fusion-spliced to the outgoing optical fiber, and then the first bridge fiber is optically coupled to the second bridge fiber. Thus, the optical axes of the bridge fibers can be adjusted as the incoming optical fiber or the outgoing optical fiber to be fusion-spliced to the bridge fiber is held without touching the first bridge fiber and the second bridge fiber.

Consequently, it is possible to prevent the bridge fiber from flaws or smears. As compared with the case in which the first bridge fiber and the second bridge fiber are in turn fusion-spliced to the incoming optical fiber or the outgoing optical fiber, it is possible to prevent an angle failure on the connecting portions of the bridge fibers even though no special jig is provided or even though the tapered portion is provided entirely in the length direction of the bridge fiber.

Accordingly, a method for manufacturing an optical combiner that can improve the reliability of the optical combiner is achieved.

In the coupling process, the first bridge fiber can be directly coupled to the second bridge fiber. In the coupling process, the first bridge fiber can be coupled to the second bridge fiber through one, two, or more other bridge fibers having the core and the cladding.

As described above, according to the present invention, it is possible to provide an optical combiner that can improve reliability, a laser device using the same, and a method for manufacturing an optical combiner.

DESCRIPTION OF EMBODIMENTS

In the following, preferred embodiments of the present invention will be described in detail with reference to the drawings.

(1) First Embodiment

Figure 1:
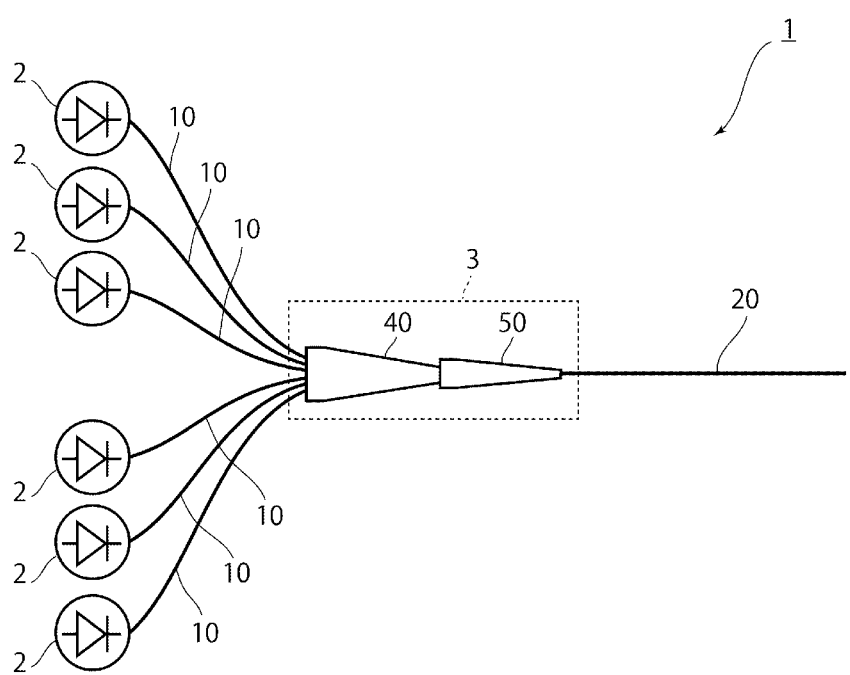
FIG. 1 is a diagram of a laser device according to a first embodiment.

FIG. 1 is a diagram of a laser device 1 according to a first embodiment. As illustrated in FIG. 1, the laser device 1 according to the embodiment includes a plurality of laser light sources 2 and an optical combiner 3 as main components.

The laser light source 2 emits laser light, such as a laser diode, or a Fabry-Perot fiber laser or fiber ring fiber laser.

The optical combiner 3 includes a plurality of incoming optical fibers 10, an outgoing optical fiber 20, a first fiber for a bridge (in the following, referred to as a first bridge fiber) 40, and a second fiber for a bridge (in the following, referred to as a second bridge fiber) 50 as main components.

Figure 2:
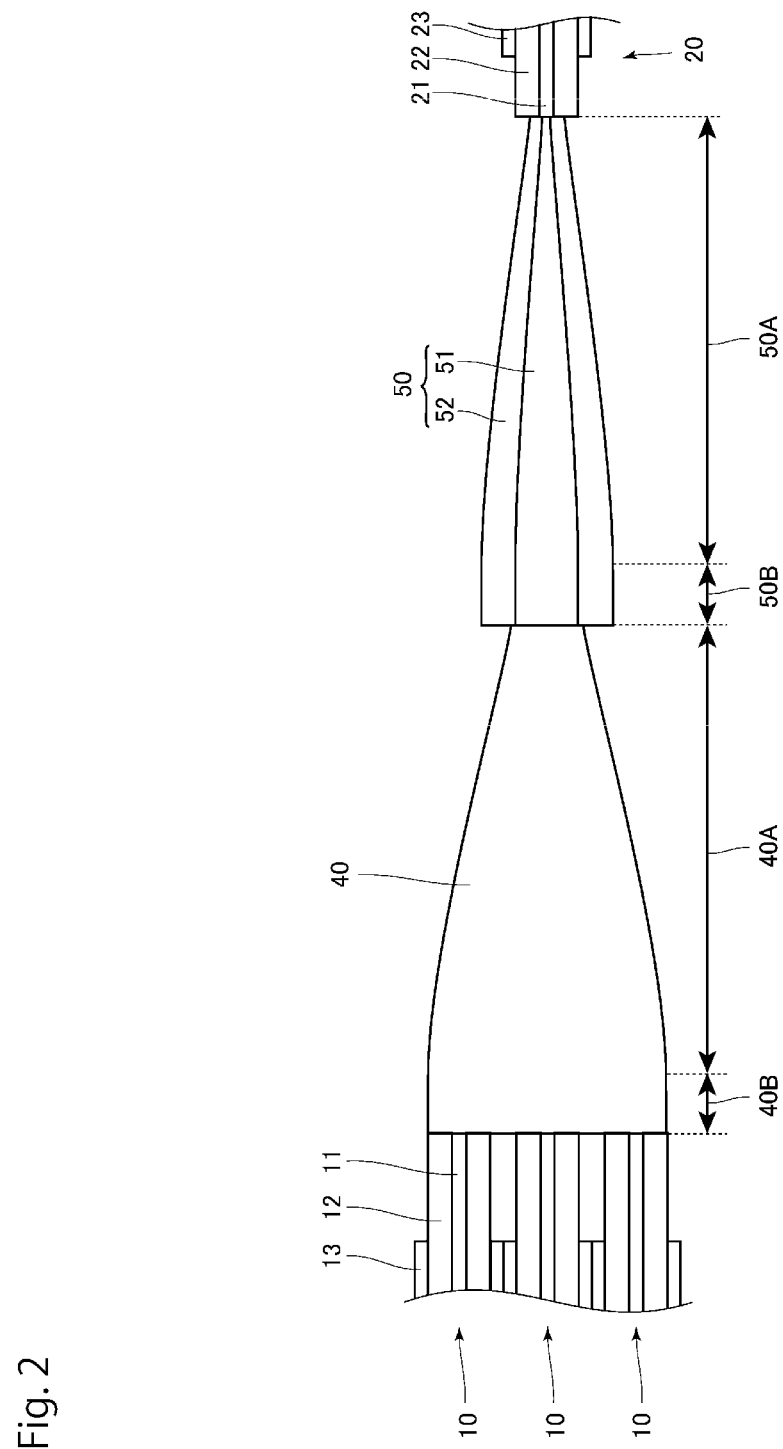
FIG. 2 is a diagram of a cross section of an optical combiner according to the first embodiment.

FIG. 2 is a diagram of a cross section of the optical combiner 3 according to the first embodiment. As illustrated in FIG. 2, the incoming optical fiber 10 is an optical fiber that enters laser light coming from the laser light source 2 to the first bridge fiber 40. The number of the incoming optical fibers 10 is the same as the number of the laser light sources. The incoming optical fibers 10 each include a core 11, a cladding 12 that surrounds the outer circumferential surface of the core 11, and a covering layer 13 that covers the cladding 12.

The refractive index of the core 11 is set higher than the refractive index of the cladding 12. For example, the core 11 is formed of pure silica, and the cladding 12 is formed of silica doped with a dopant, such as fluorine, to decrease the refractive index.

The outgoing optical fiber 20 is an optical fiber that emits laser light coming from the second bridge fiber 50 to the subsequent stage, including a core 21, a cladding 22 that surrounds the outer circumferential surface of the core 21, and a covering layer 23 that covers the cladding 22.

The refractive index of the core 21 is set higher than the refractive index of the cladding 22. For example, the core 21 is formed of pure silica, and the cladding 22 is formed of silica doped with a dopant, such as fluorine, to decrease the refractive index.

The first bridge fiber 40 and the second bridge fiber 50 are provided between the plurality of incoming optical fibers 10 and the outgoing optical fiber 20, and optically coupled to each other. The first bridge fiber 40 in the previous stage located on the incoming optical fiber 10 side is optically coupled to the incoming optical fibers 10. The second bridge fiber 50 in the subsequent stage located on the outgoing optical fiber 20 side is optically coupled to the outgoing optical fiber 20.

The first bridge fiber 40 has no core-cladding structure. The entire bridge fiber 40 is a component that propagates light beams.

The refractive index of the first bridge fiber 40 can have any values. From the viewpoint of decreasing the reflection of light beams entered from the incoming optical fibers 10, the refractive index of the first bridge fiber 40 is preferably nearly equal to the refractive index of the core 11 of the incoming optical fiber 10. For example, the first bridge fiber 40 is formed of pure silica.

The first bridge fiber 40 has a tapered portion 40A where the outer diameter is more decreased toward the emission end. In the first bridge fiber 40 according to the embodiment, the tapered portion 40A is a portion from the position in the midway point between the incoming end and the emission end to the emission end. A constant diameter portion 40B is a portion from the incoming end to the position in the midway point. The constant diameter portion 40B has a constant outer diameter along the length direction of the bridge fiber 40.

The tapered portion 40A is integrally formed with the constant diameter portion 40B. The outer diameter of the large-diameter end face of the tapered portion 40A matches the outer diameter of the constant diameter portion 40B. In other words, the outer diameter of the incoming end face of the bridge fiber 40 matches the outer diameter of the large-diameter end face of the tapered portion 40A, and is the greatest in the bridge fiber 40. On the other hand, the outgoing end face of the bridge fiber 40 is the small-diameter end face of the tapered portion 40A, and the outer diameter of the outgoing end face is the smallest in the bridge fiber 40.

The incoming end face of the first bridge fiber 40 thus configured is fusion-spliced to the core 11 and the cladding 12 on the outgoing end face of each of the incoming optical fibers 10.

The second bridge fiber 50 includes a core 51 and a cladding 52 that covers the core 51. In other words, in the second bridge fiber 50, the core 51, which is a core layer of the second bridge fiber 50, is a component that propagates light beams.

The refractive index of the core 51 is set higher than the refractive index of the cladding 52. For example, the core 51 is formed of pure silica, and the cladding 52 is formed of silica doped with a dopant, such as fluorine, to decrease the refractive index. From the viewpoint of decreasing the reflection of light beams entered from the first bridge fiber 40, the refractive index of the core 51 is preferably nearly equal to the refractive index of the first bridge fiber 40. For example, the core 51 is formed of pure silica.

This second bridge fiber 50 has a tapered portion 50A where the outer diameter is more decreased toward the emission end. Similarly to the first bridge fiber 40, in the second bridge fiber 50 according to the embodiment, the tapered portion 50A is a portion from the position in the midway point between the incoming end and the emission end to the emission end. A constant diameter portion 50B is a portion from the incoming end to the position in the midway point.

The outer diameter of the incoming end face of this second bridge fiber 50 matches the outer diameter of the large-diameter end face of the tapered portion 50A (the outer diameter of the cladding). The outer diameter of the core on the incoming end face is set greater than the outer diameter of the outgoing end face of the first bridge fiber 40 (the small-diameter end face of the tapered portion 40A).

The incoming end face of the second bridge fiber 50 thus configured is fusion-spliced to the outgoing end face of the first bridge fiber 40 in the state in which the core 51 of the outgoing end face includes the outgoing end face.

On the other hand, the outgoing end face of the second bridge fiber 50 is the small-diameter end face of the tapered portion 50A. The outer diameter of the core on the outgoing end face is made smaller than the outer diameter of the core on the incoming end face of the outgoing optical fiber 20.

The outgoing end face of the core 51 of the second bridge fiber 50 thus configured is fusion-spliced to the incoming end face of the core 21 of the outgoing optical fiber 20 in the state in which the core 51 is included in the core 21.

In the incoming optical fibers 10, the covering layer 13 at one end, which is fusion-spliced to the first bridge fiber 40, is removed. In the outgoing optical fiber 20, the covering layer 23 at one end, which is fusion-spliced to the second bridge fiber 50, is removed.

Figure 3:
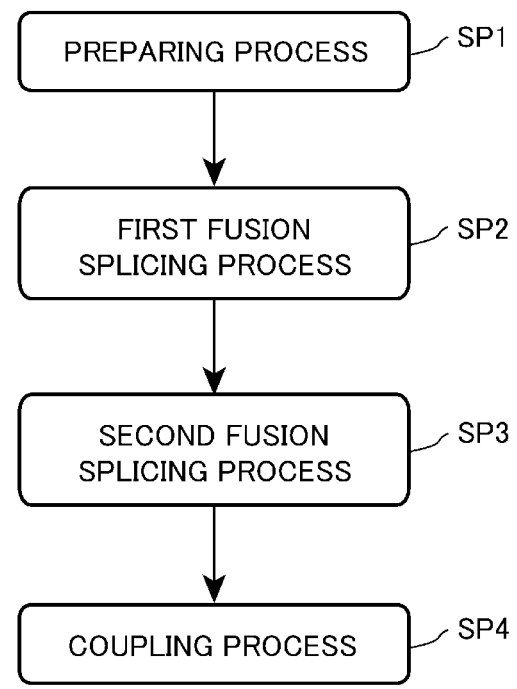
FIG. 3 is a flowchart of a method for manufacturing the optical combiner.

Next, referring to FIGS. 3 and 4, a method for manufacturing the optical combiner 3 above will be described. FIG. 3 is a flowchart of a method for manufacturing the optical combiner 3. FIGS. 4A and 4B are diagrams of a fusion splicing process of the method for manufacturing the optical combiner 3.

As illustrated in FIG. 3, the method for manufacturing the optical combiner 3 includes a preparing process P1, a first fusion splicing process P2, a second fusion splicing process P3, and a coupling process P4 as main processes.

The preparing process P1 is a process of preparing the plurality of incoming optical fibers 10, the outgoing optical fiber 20, the first bridge fiber 40, and the second bridge fiber 50, which are the components of the optical combiner 3.

For example, a rod-like glass body is heated, the one end of the glass body is drawn, and then the first bridge fiber 40 can be obtained. For example, a rod-like optical fiber including the core and surrounding the outer circumferential surface of the core is heated, one end of the optical fiber rod is drawn, and then the second bridge fiber 50 can be obtained.

Figure 4A:
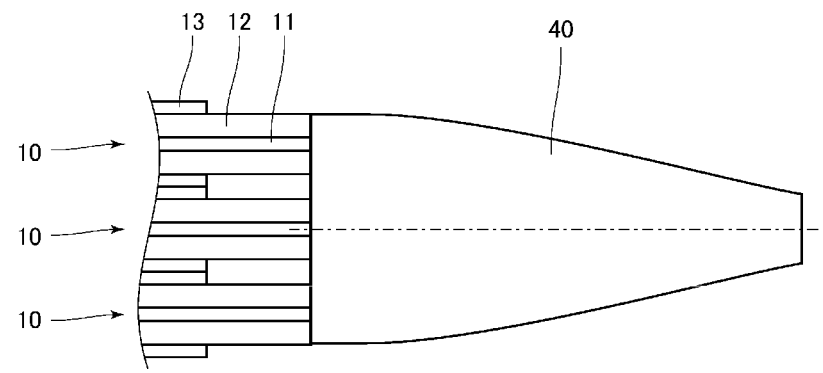
FIGS. 4A and 4B are diagrams of a fusion splicing process of a method for manufacturing the optical combiner.

As illustrated in FIG. 4A, the first fusion splicing process P2 is a process of fusion-splicing the outgoing end faces of the plurality of incoming optical fibers 10 to the incoming end face of the first bridge fiber 40.

In this first fusion splicing process P2, the outgoing end faces of the incoming optical fibers 10 are preferably fusion-spliced to the incoming end face of the first bridge fiber 40 in the state in which the distance between the cores of the adjacent incoming optical fibers 10 is almost the same on the incoming end face of the first bridge fiber 40.

Figure 4B:
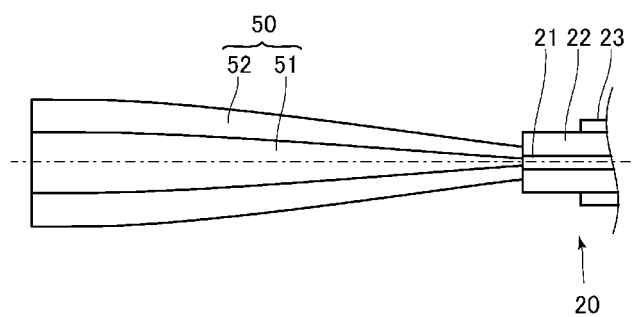

As illustrated in FIG. 4B, the second fusion splicing process P3 is a process of fusion-splicing the incoming end face of the outgoing optical fiber 20 to the outgoing end face of the second bridge fiber 50.

In this second fusion splicing process P3, the outgoing end face of the second bridge fiber 50 is fusion-spliced to the incoming end face of the outgoing optical fiber 20 in the state in which the core 51 of the second bridge fiber 50 on the outgoing end face is included in the core 21 of the outgoing optical fiber 20 on the incoming end face. As depicted by an alternate long and short dash line in FIG. 4B, the optical axis of the core 51 of the second bridge fiber 50 preferably matches the optical axis of the core 21 of the outgoing optical fiber 20.

In the embodiment, the first fusion splicing process P2 is first performed, and then the second fusion splicing process P3 is performed. However, the second fusion splicing process P3 may be first performed, and then the first fusion splicing process P2 may be performed.

The coupling process P4 is a process of optically coupling the first bridge fiber 40 after the first fusion splicing process P2 to the second bridge fiber 50 after the second fusion splicing process P3.

In the case of the embodiment, in this coupling process P4, the first bridge fiber 40 is directly fusion-spliced to the second bridge fiber 50. In other words, the outgoing end face of the first bridge fiber 40 is fusion-spliced to the incoming end face of the second bridge fiber 50 in the state in which the outgoing end face (the small-diameter end face of the tapered portion 40A) is included in the incoming end face. Preferably, the optical axis of the first bridge fiber 40 depicted by an alternate long and short dash line in FIG. 4A matches the optical axis of the core 51 of the second bridge fiber 50 depicted by the alternate long and short dash line in FIG. 4B.

As described above, in the method for manufacturing the optical combiner 3, the first bridge fiber 40 is fusion-spliced to the plurality of incoming optical fibers 10, the second bridge fiber 50 is fusion-spliced to the outgoing optical fiber 20, and then the first bridge fiber 40 is fusion-spliced to the second bridge fiber 50.

Thus, the optical axes of the bridge fibers can be adjusted as the incoming optical fiber 10 or the outgoing optical fiber 20 to be fusion-spliced to one of the bridge fibers is held without touching the first bridge fiber 40 and the second bridge fiber 50.

Consequently, it is possible to provide the optical combiner 3 that can improve reliability as the first bridge fiber 40 and the second bridge fiber 50 are prevented from flaws or smears. Moreover, in coupling the bridge fibers to each other, it is unnecessary to adjust the optical axes of the bridge fibers as the tapered portion 40A of the first bridge fiber or the tapered portion 50A of the second bridge fiber 50 is held. Thus, as compared with the case in which the first bridge fiber 40 and the second bridge fiber 50 are in turn fusion-spliced to the incoming optical fiber 10 or the outgoing optical fiber 20, it is possible to prevent an angle failure on the connecting portions of the bridge fibers with no special jig.

In the case in which the tapered portion 40A is provided entirely in the length direction of the first bridge fiber 40 and the tapered portion 50A is provided entirely in the length direction of the second bridge fiber 50, it is difficult to adjust the optical axes as the tapered portions 40A and 50A are held. Therefore, in such cases, the optical axes of the bridge fibers can be adjusted as the incoming optical fiber 10 or the outgoing optical fiber 20 is held. This is specifically useful from the viewpoint of preventing an angle failure on the connecting portions of the bridge fibers.

By the manufacturing method as described above, the optical combiner 3 as illustrated in FIG. 2 is manufactured. In this optical combiner 3, the first bridge fiber 40 and the second bridge fiber 50 optically coupled to each other are provided between the plurality of incoming optical fibers 10 and the outgoing optical fiber 20.

The ratio of the outer diameter of the core 41 to the outer diameter of the cladding 42 of the first bridge fiber 40 is greater than the ratio of the outer diameter of the core 51 to the outer diameter of the cladding 52 of the second bridge fiber 50. In other words, the ratio of the outer diameter of the core to the outer diameter of the cladding is smaller in a bridge fiber located more apart from the incoming optical fiber 10. The ratio of the outer diameter of the core to the outer diameter of the cladding means a ratio A/B where the outer diameter of the core is defined as A, and the outer diameter of the cladding is defined as B.

Therefore, as compared with the case of using one bridge fiber in which the ratio of the outer diameter of the core to the outer diameter of the cladding is the same instead of the first bridge fiber 40 and the second bridge fiber 50, it is possible to decrease the diameter difference between the incoming end face of the first bridge fiber 40 to which the plurality of incoming optical fibers 10 is coupled and the outgoing end face of the second bridge fiber 50 to which the outgoing optical fiber 20 is coupled. Accordingly, it is possible to decrease the distortion of the tapered portion 40A of the first bridge fiber 40 and the tapered portion 50A of the second bridge fiber 50.

As compared with the case of using one bridge fiber in which the ratio of the outer diameter of the core to the outer diameter of the cladding is the same instead of the first bridge fiber 40 and the second bridge fiber 50, it is possible to decrease the ratio of the outer diameter of the core 51 to the outer diameter of the cladding 52 of the second bridge fiber 50 on the outgoing end face of the second bridge fiber 50 coupled to the outgoing optical fiber 20. Accordingly, the second bridge fiber 50 can be more firmly coupled to the outgoing optical fiber 20.

As compared with the case of using one bridge fiber in which the ratio of the outer diameter of the core to the outer diameter of the cladding is the same instead of the first bridge fiber 40 and the second bridge fiber 50, it is possible to increase the ratio of the outer diameter of the core 41 to the outer diameter of the cladding 42 of the first bridge fiber 40 coupled to the plurality of incoming optical fibers 10. Accordingly, it is possible to reduce the leakage of light beams entered from the incoming optical fiber 10 to the first bridge fiber 40.

As described above, the optical combiner 3 that can improve reliability and the method for manufacturing the optical combiner are achieved. Moreover, it is also possible to improve the reliability of the laser device 1 including the optical combiner 3 thus manufactured.

(2) Second Embodiment

Next, a second embodiment will be described in detail with reference to the drawing. However, in the second embodiment, components the same as or equivalent to the components of the first embodiment are designated the same reference numerals and signs, and the overlapping description will be appropriately omitted.

Figure 5:
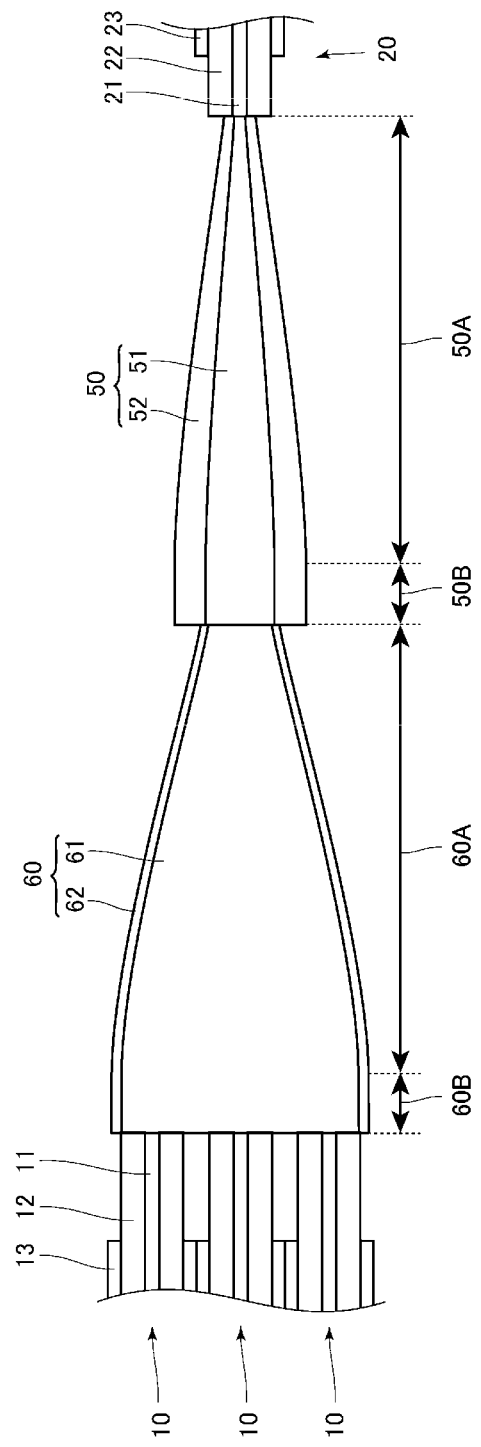
FIG. 5 is a diagram of an optical combiner according to a second embodiment.

FIG. 5 is a diagram of an optical combiner according to the second embodiment. As illustrated in FIG. 5, the optical combiner according to the embodiment is different from the first embodiment in that bridge fibers in two stags have a core-cladding structure.

In other words, instead of the first bridge fiber 40 according to the first embodiment, the optical combiner according to the embodiment includes a first bridge fiber 60 having a core 61 and a cladding 62 that surrounds the outer circumferential surface of the core 61.

The refractive index of the core 61 is set higher than the refractive index of the cladding 62. The refractive index difference between the core 61 and the cladding 62 is set smaller than the refractive index difference between a core 51 and a cladding 52 of a second bridge fiber 50.

Similarly to the first bridge fiber 40 according to the first embodiment, this first bridge fiber 60 is configured of a tapered portion 60A where the outer diameter is more decreased toward the emission end and a constant diameter portion 60B where the outer diameter is constant along the length direction of the first bridge fiber 60.

The outer diameter of the incoming end face of the first bridge fiber 60 matches the outer diameter (the outer diameter of the cladding) of the large-diameter end face of the tapered portion 60A. The core 61 on the incoming end face is fusion-spliced to a core 11 and a cladding 12 on the outgoing end face of each of incoming optical fibers 10.

On the other hand, the outer diameter of the outgoing end face of the first bridge fiber 60 is the small-diameter end face of the tapered portion 60A. The core outer diameter of the core 61 on the outgoing end face is set smaller than the core outer diameter of the core 51 on the incoming end face of the second bridge fiber 50. The incoming end face of the second bridge fiber 50 is fusion-spliced to the outgoing end face of the first bridge fiber 60 in the state in which the core 61 on the outgoing end face is included in the core 51 on the incoming end face.

In the optical combiner according to the embodiment, the ratio of the outer diameter of the core 61 to the outer diameter of the cladding 62 of the first bridge fiber 60 is set greater than the ratio of the outer diameter of the core 51 to the outer diameter of the cladding 52 of the second bridge fiber 50.

The optical combiner according to the second embodiment thus configured is manufactured through the preparing process P1, the first fusion splicing process P2, the second fusion splicing process P3, and the coupling process P4 described in the first embodiment above.

In the preparing process P1, a plurality of incoming optical fibers 10, the outgoing optical fiber 20, the first bridge fiber 60, and the second bridge fiber 50 are prepared.

Similarly to the second bridge fiber 50, for example, a rod-like optical fiber including the core and surrounding the outer circumferential surface of the core is heated, one end of the optical fiber is drawn, and then the first bridge fiber 60 can be obtained.

Similarly to the case described in the first embodiment, in the first fusion splicing process P2, the outgoing end face of each of the plurality of incoming optical fibers 10 is fusion-spliced to the incoming end face of the first bridge fiber 60. Similarly to the case described in the first embodiment, in the second fusion splicing process P3, the incoming end face of the outgoing optical fiber 20 is fusion-spliced to the outgoing end face of the second bridge fiber 50.

In the coupling process P4, the first bridge fiber 60 after the first fusion splicing process P2 is optically coupled to the second bridge fiber 50 after the second fusion splicing process P3. Similarly to the case of the foregoing first embodiment, in the case of the embodiment, the first bridge fiber 60 is contacted and fusion-spliced to the second bridge fiber 50.

In other words, the outgoing end face of the first bridge fiber 40 is fusion-spliced to the incoming end face of the second bridge fiber 50 in the state in which the outgoing end face (the small-diameter end face of the tapered portion 40A) is included in the incoming end face. Preferably, the optical axis of the first bridge fiber 60 matches the optical axis of the second bridge fiber 50.

As described above, in the method for manufacturing the optical combiner according to the embodiment, the first bridge fiber 60 is fusion-spliced to the plurality of incoming optical fibers 10, the second bridge fiber 50 is fusion-spliced to the outgoing optical fiber 20, and then the second bridge fiber 50 is fusion-spliced to the first bridge fiber 60.

Accordingly, similarly to the case of the foregoing first embodiment, the first bridge fiber 60 and the second bridge fiber 50 can be prevented from flaws or smears. As compared with the case in which the first bridge fiber 60 and the second bridge fiber 50 are in turn fusion-spliced to the incoming optical fiber 10 or the outgoing optical fiber 20, it is possible to prevent an angle failure on the connecting portions of the bridge fibers with no special jig.

By the manufacturing method as described above, the optical combiner as illustrated in FIG. 5 is manufactured. In this optical combiner, the first bridge fiber 60 and the second bridge fiber 50, which are optically coupled to each other, are provided between the plurality of incoming optical fibers 10 and the outgoing optical fiber 20.

Therefore, similarly to the case of the foregoing first embodiment, as compared with the case of using one bridge fiber in which the ratio of the outer diameter of the core to the outer diameter of the cladding is the same instead of the first bridge fiber 60 and the second bridge fiber 50, it is possible to decrease the diameter difference between the incoming end face of the first bridge fiber 60 and the outgoing end face of the second bridge fiber 50. Accordingly, it is possible to decrease the distortion of the tapered portion 60A of the first bridge fiber 60 and the tapered portion 50A of the second bridge fiber 50.

In the case of the embodiment, the refractive index difference between the core 61 and the cladding 62 of the first bridge fiber 60 located on the incoming optical fiber side is set smaller than the refractive index difference between the core 51 and the cladding 52 of the second bridge fiber 50 located on the outgoing optical fiber side. In other words, the refractive index difference is set greater in a bridge fiber located more apart from the incoming optical fiber 10.

Thus, the mode number of light beams propagating through the second bridge fiber 50 can be increased more than the mode number of light beams propagating through the first bridge fiber 60. Therefore, it is possible to further reduce the leakage of a light beam from the connecting portion of the adjacent first bridge fiber 60 to the second bridge fiber 50.

Moreover, in the case of the embodiment, the outer diameter of the core on the outgoing end face of the first bridge fiber 60 located on the incoming optical fiber side is set smaller than the outer diameter of the core on the incoming end face of the second bridge fiber 50 located on the outgoing optical fiber side. Thus, it is possible to further reduce the leakage of a light beam from the connecting portion of the first bridge fiber 60 to the second bridge fiber 50.

(3) Exemplary Modifications

As described above, the first embodiment and the second embodiment are described as examples. However, the present invention is not limited to the foregoing embodiments.

For example, in the foregoing first and second embodiments, the bridge fiber configured of the tapered portion and the constant diameter portion is applied. However, a bridge fiber from which the constant diameter portion is omitted may be applied.

In the foregoing first embodiment, the entire first bridge fiber 40, which is located nearest to the incoming optical fiber side, propagates light beams (the first bridge fiber 40 is not in a core-cladding structure). The bridge fiber other than the first bridge fiber 40 is one second bridge fiber 50 having the core 51 and the cladding 52.

However, for the bridge fiber other than the first bridge fiber 40, two or more second bridge fibers 50 may be provided between the first bridge fiber 40 and the outgoing optical fiber 20. In the case in which two or more second bridge fibers 50 are provided between the first bridge fiber 40 and the outgoing optical fiber 20 in this manner, the core-to-cladding ratio of these second bridge fibers 50 is preferably similarly set as in the foregoing first embodiment.

In other words, preferably, in each of two or more second bridge fibers 50, the ratio of the outer diameter of the core 51 to the outer diameter of the cladding 52 of the second bridge fiber 50 is smaller in a bridge fiber located more apart from the incoming optical fiber 10.

This can further decrease the ratio of the outer diameter of the core 51 to the outer diameter of the cladding 52 of the second bridge fiber 50 on the outgoing end face of the second bridge fiber 50 coupled to the outgoing optical fiber 20, as compared with the case in which one second bridge fiber 50 is provided. Thus, it is possible to further reinforce the coupling of the second bridge fiber 50 to the outgoing optical fiber 20.

Moreover, preferably, the refractive index difference between the core 51 and the cladding 52 of two or more second bridge fibers 50 is greater in a bridge fiber located more apart from the incoming optical fiber 10.

This can further increase the mode number of light beams propagating through the second bridge fiber 50 in the second bridge fiber 50 located more apart from the incoming optical fiber 10. Therefore, it is possible to further reduce the leakage of a light beam from the connecting portion of the adjacent second bridge fibers 50.

Furthermore, in the adjacent second bridge fibers 50 in two or more second bridge fibers 50, the outer diameter of the core on the outgoing end face of the second bridge fiber 50 located on the incoming optical fiber side is preferably smaller than the outer diameter of the core on the incoming end face of the second bridge fiber 50 located on the outgoing optical fiber side.

This can further reduce the leakage of a light beam from the connecting portion of the adjacent second bridge fibers 50.

In the case of manufacturing an optical combiner provided with two or more second bridge fibers 50 between the first bridge fiber 40 and the outgoing optical fiber 20, the coupling process P4 is changed. In other words, instead of directly coupling the first bridge fiber 40 after the first fusion splicing process P2 to the second bridge fiber 50 after the second fusion splicing process P3, the first bridge fiber 40 is coupled to the second bridge fiber 50 through one, two, or more other bridge fibers 50.

In the foregoing second embodiment, between the incoming optical fibers 10 and the outgoing optical fiber 20, two bridge fibers, the first bridge fiber 60 having the core 61 and the cladding 62 and the second bridge fiber 50 having the core 51 and the cladding 52, are provided.

However, three or more bridge fibers may be provided so that in these bridge fibers, a bridge fiber located more apart from the incoming optical fibers 10 has a smaller ratio of the outer diameter of the core to the outer diameter of the cladding.

In the case in which these three or more bridge fibers are provided between the incoming optical fibers 10 and the outgoing optical fiber 20, the refractive index difference between the core and the cladding in the bridge fibers is preferably greater in a bridge fiber located more apart from the incoming optical fibers 10 as described above.

In the case in which three or more bridge fibers are provided between the incoming optical fibers 10 and the outgoing optical fiber 20, in the adjacent bridge fibers, the outer diameter of the core on the outgoing end face of the bridge fiber located on the incoming optical fiber side is preferably smaller than the outer diameter of the core on the incoming end face of the bridge fiber located on the outgoing optical fiber side, as described above.

In the case of manufacturing an optical combiner provided with three or more bridge fibers between the incoming optical fibers 10 and the outgoing optical fiber 20, the coupling process P4 is changed, as described above. In other words, instead of directly coupling the first bridge fiber 60 after the first fusion splicing process P2 to the second bridge fiber 50 after the second fusion splicing process P3, the first bridge fiber 60 is coupled to the second bridge fiber 50 through one, two, or more other bridge fibers.

In the foregoing embodiments, the components of the laser light source 2 are not described specifically. However, any components that can emit laser light are possible.

Moreover, in the foregoing embodiments, the laser device 1 including the plurality of laser light sources 2 and the optical combiner 3 as components is applied. However, for example, a resonance fiber laser device or a master oscillator power amplifier (MO-PA) fiber laser device may be applied, or other laser devices may be applied.

The components of the laser device 1 and the components of the optical combiner 3 can be appropriately combined, omitted, modified, or additionally provided with known techniques, for example, in the scope not deviating from the gist of the present application, other than the content described in the foregoing embodiments or the exemplary modifications.

The present invention can be used in various fields including processing fields and medical fields using laser devices or in various fields using optical fiber combiners.

REFERENCE SIGNS LIST

1 . . . laser device
2 . . . laser light source
3 . . . optical combiner
10 . . . incoming optical fiber
20 . . . outgoing optical fiber
40, 60 . . . first bridge fiber
50 . . . second bridge fiber

The invention claimed is:
1. An optical combiner comprising:
a plurality of incoming optical fibers;
an outgoing optical fiber; and
a plurality of bridge fibers provided between the plurality of incoming optical fibers and the outgoing optical fiber, the plurality of bridge fibers being optically coupled to each other, wherein
each of the plurality of bridge fibers has a core, a cladding that surrounds an outer circumferential surface of the core, and a tapered portion where an outer diameter is more decreased toward an emission end,
the plurality of bridge fibers includes a first bridge fiber and a second bridge fiber, the second bridge fiber being disposed closer to the outgoing optical fiber than the first bridge fiber,
the second bridge fiber has a ratio of an outer diameter of the core to an outer diameter of the cladding smaller than the ratio of the outer diameter of the core to the outer diameter of the cladding of the first bridge fiber, and in the plurality of bridge fibers, a bridge fiber to which the outgoing optical fiber is coupled is fusion-spliced to the outgoing optical fiber and has the cladding made of silica and having a uniform refractive index.

2. An optical combiner comprising:

a plurality of incoming optical fibers;

an outgoing optical fiber; and a plurality of bridge fibers provided between the plurality of incoming optical fibers and the outgoing optical fiber, the plurality of bridge fibers being optically coupled to each other, wherein each of the plurality of bridge fibers has a tapered portion where an outer diameter is more decreased toward an emission end, in the plurality of bridge fibers, a bridge fiber to which the plurality of incoming optical fibers is coupled entirely propagates a light beam, and two or more bridge fibers other than the bridge fiber have a core and a cladding that surrounds an outer circumferential surface of the core, the two or more bridge fibers include a first bridge fiber and a second bridge fiber, the second bridge fiber being disposed closer to the outgoing optical fiber than the first bridge fiber, the second bridge fiber has a ratio of an outer diameter of the core to an outer diameter of the cladding smaller than the ratio of the outer diameter of the core to the outer diameter of the cladding of the first bridge fiber, and in the two or more bridge fibers, a bridge fiber to which the outgoing optical fiber is coupled is fusion-spliced to the outgoing optical fiber and has the cladding made of silica and having a uniform refractive index.

3. The optical combiner according to claim 1, wherein a refractive index difference between the core and the cladding is greater in the second bridge fiber than the refractive index difference in the first bridge fiber.

4. The optical combiner according to claim 2, wherein a refractive index difference between the core and the cladding is greater in the second bridge fiber than refractive index difference in the first bridge fiber.

5. The optical combiner according to claim 1, wherein an outer diameter of the core on an outgoing end face of a bridge fiber which is fusion-spliced to the outgoing optical fiber is smaller than an outer diameter of the core on an incoming end face of the outgoing optical fiber.

6. The optical combiner according to claim 2, wherein an outer diameter of the core on an outgoing end face of a bridge fiber which is fusion-spliced to the outgoing optical fiber is smaller than an outer diameter of the core on an incoming end face of the outgoing optical fiber.

7. A laser device comprising:

the optical combiner according to claim 1; and a laser light source for applying laser light to the incoming optical fiber.

* * * * *